United States Patent [19]

Chang et al.

[11] Patent Number: 5,028,565
[45] Date of Patent: Jul. 2, 1991

[54] PROCESS FOR CVD DEPOSITION OF TUNGSTEN LAYER ON SEMICONDUCTOR WAFER

[75] Inventors: Mei Chang, Cupertino; Cissy Leung, Fremont; David N. Wang, Saratoga; David Cheng, San Jose, all of Calif.

[73] Assignee: Applied Materials, Inc., Santa Clara, Calif.

[21] Appl. No.: 398,653

[22] Filed: Aug. 25, 1989

[51] Int. Cl.$^5$ .......................................... H01L 21/285
[52] U.S. Cl. ................................... 437/192; 437/195; 437/190; 148/DIG. 25
[58] Field of Search ............... 437/192, 195, 189, 190, 437/195; 148/DIG. 25

[56] References Cited

U.S. PATENT DOCUMENTS 4,785,962  11/1988  Toshima ............................ 220/260
4,800,105  1/1989  Nakayama et al. ................ 427/253

FOREIGN PATENT DOCUMENTS 0254651  1/1988  European Pat. Off. .

OTHER PUBLICATIONS

Toshi et al, "The Role of Process Parameters of Selective W Deposited by SiH$_4$, H$_2$, and WF$_6$ Chemistry in Terms of Shallow Junction Leakages", Materials Research Society, pp. 85-92, 1989.

Broadbent et al, "Selective Tungsten Processing by LPCUD", Solid State Tech., pp. 51-59 12/85.
Morosami et al, "Kinetics and Properties of CVD Tungsten Film on hion Substrates", pp. 181-203.
Broadbent et al., "Selective Low Pressure CVD of Tungsten", Solid State Science and Tech., vol. 131, No. 6, 6/84, pp. 1427-1433.
Lifshntz et al., "Shallow Shieded Diodes with LPCND Tungsten Plug", Materials Research SOciety 1988, pp. 225-229.

Primary Examiner—Olik Chaudhuri
Assistant Examiner—Tuan Nguyen
Attorney, Agent, or Firm—John P. Taylor

[57] ABSTRACT

An improved process is disclosed for the deposition of a layer of tungsten on a semiconductor wafer in a vacuum chamber wherein the improvements comprise depositing tungsten on the semiconductor wafer in the presence of nitrogen gas to improve the reflectivity of the surface of the resulting layer of tungsten; maintaining the vacuum chamber at a pressure of from about 20 to 760 Torr to improve the deposition rate of the tungsten, as well as to improve the reflectivity of the tungsten surface; and, when needed, the additional step of forming a nucleation layer on the semiconductor layer prior to the step of depositing tungsten on the semiconductor wafer to improve the uniformity of the deposited tungsten layer.

18 Claims, 1 Drawing Sheet

---

CVD DEPOSITING A TUNGSTEN LAYER OF INCREASED REFELECTIVITY ON A SEMICONDUCTOR WAFER IN A VACUUM CHAMBER USING A MIXTURE OF ARGON, NITROGEN, HYDROGEN, AND WF$_6$ GASES

↓

MAINTAINING A VACUUM OF FROM ABOUT 20 TO ABOUT 760 TORR IN THE VACUUM CHAMBER DURING THE DEPOSITION TO IMPROVE THE STEP COVERAGE AND THE DEPOSITION RATE

↓

OPTIONALLY FORMING A NUCLEATION LAYER ON THE SEMICONDUCTOR WAFER PRIOR TO THE DEPOSITION OF TUNGSTEN TO FORM A MORE UNIFORM TUNGSTEN LAYER

```
┌─────────────────────────────────────┐
│  CVD DEPOSITING A TUNGSTEN LAYER OF │
│       INCREASED REFELECTIVITY ON    │
│   A SEMICONDUCTOR WAFER IN A VACUUM │
│   CHAMBER USING A MIXTURE OF ARGON, │
│   NITROGEN, HYDROGEN, AND WF₆ GASES │
└─────────────────────────────────────┘
                    │
┌─────────────────────────────────────┐
│   MAINTAINING A VACUUM OF FROM ABOUT│
│   20 TO ABOUT 760 TORR IN THE VACUUM│
│    CHAMBER DURING THE DEPOSITION TO │
│       IMPROVE THE STEP COVERAGE AND │
│           THE DEPOSITION RATE       │
└─────────────────────────────────────┘
                    │
┌─────────────────────────────────────┐
│    OPTIONALLY FORMING A NUCLEATION  │
│    LAYER ON THE SEMICONDUCTOR WAFER │
│   PRIOR TO THE DEPOSITION OF TUNGSTEN│
│  TO FORM A MORE UNIFORM TUNGSTEN LAYER│
└─────────────────────────────────────┘
```

PROCESS FOR CVD DEPOSITION OF TUNGSTEN LAYER ON SEMICONDUCTOR WAFER

BACKGROUND OF THE INVENTION

1. Field of the Invention

This invention relates to the processing of semiconductor wafers. More particularly, this invention relates to improvements in the process of depositing a tungsten layer on a semiconductor wafer.

2. Description of the Related Art

In the formation of integrated circuit structures on and in a semiconductor wafer such as a silicon wafer, one or more metals layers are conventionally used to form conductive interconnects or wiring harnesses to various contacts on the processed wafer. Such metal wiring harnesses or patterned metal layers have, in the past, utilized either aluminum or gold as the metal. From an economical standpoint, aluminum is preferred to gold. However, as the geometries of the integrated circuit structures become smaller and smaller, the use of tungsten metal, instead of aluminum, has become preferred due to the better step coverage and filling of small contact holes or vias by CVD tungsten.

However, the blanket deposition of a layer of tungsten on a semiconductor wafer is not without problems. First of all, the conventional deposition of tungsten at about 350° C. is rather slow, i.e., about 300 Angstroms per minute. Higher rates, e.g., about 1000 Angstroms per minute, are achievable, but only by raising the temperature up to about 500–550° C., which may risk damage to underlying portions of the integrated circuit structure.

Furthermore, the resulting layer of tungsten is not always smooth, resulting in a reflectivity which may be only 20% or less that of a silicon surface, making subsequent patterning of the tungsten layer by photolithography techniques more difficult. Also, the uniformity of the deposition may vary over 1% in thickness across the wafer, as measured by the resistivity.

It would, therefore, be beneficial to provide improvements in the process for the blanket deposition of a tungsten layer on a semiconductor wafer wherein the deposition rate could be accelerated and the reflectivity of the resulting tungsten layer improved, as well as providing a more uniform layer.

SUMMARY OF THE INVENTION

It is, therefore, an object of this invention to provide an improved process for the deposition of a layer of tungsten on a semiconductor wafer in a vacuum chamber wherein the improvement comprises depositing tungsten on a semiconductor wafer in the presence of nitrogen gas to improve the reflectivity of the resulting layer of tungsten.

It is another object of this invention to provide an improved process for the deposition of a layer of tungsten on a semiconductor wafer in a vacuum chamber wherein the improvement comprises depositing tungsten on a semiconductor wafer at a pressure of from about 20 to 760 Torr to improve the tungsten deposition rate, as well as to improve the reflectivity of the surface of the tungsten layer.

It is yet another object of this invention to provide an improved process for the deposition of a layer of tungsten on a semiconductor wafer in a vacuum chamber wherein the improvement comprises the additional step of forming a nucleation layer on the semiconductor layer prior to the step of depositing tungsten on the semiconductor wafer to improve the uniformity of the deposited layer of tungsten.

It is still another object of this invention to provide an improved process for the deposition of a layer of tungsten on a semiconductor wafer in a vacuum chamber wherein the improvements comprise the additional step of forming a nucleation layer on the semiconductor layer prior to the step of depositing tungsten on the semiconductor wafer to improve the uniformity of the deposited tungsten layer; and then depositing tungsten over the nucleation layer on the semiconductor wafer in the presence of nitrogen gas to improve the reflectivity of the resulting layer of tungsten.

It is a further object of this invention to provide an improved process for the deposition of a layer of tungsten on a semiconductor wafer in a vacuum chamber wherein the improvements comprise the step of forming a nucleation layer on the semiconductor layer prior to the step of depositing tungsten on the semiconductor wafer to improve the uniformity of the deposited tungsten layer; and then depositing tungsten over the nucleation layer on the semiconductor wafer at a pressure of from about 20 to 760 Torr to improve the tungsten deposition rate, as well as to improve the reflectivity of the surface of the tungsten layer.

It is yet a further object of this invention to provide an improved process for the deposition of a layer of tungsten on a semiconductor wafer in a vacuum chamber wherein the improvements comprise depositing tungsten on the semiconductor wafer in the presence of nitrogen gas and at a pressure of from about 20 to 760 Torr to improve the reflectivity of the surface of the resulting tungsten layer, as well as to improve the tungsten deposition rate.

Finally, it is still a further object of this invention to provide an improved process for the deposition of a layer of tungsten on a semiconductor wafer in a vacuum chamber wherein the improvements comprise the additional step of forming a nucleation layer on the semiconductor layer prior to the step of depositing tungsten on the semiconductor wafer to improve the uniformity of the deposited tungsten layer; and then depositing tungsten over the nucleation layer on the semiconductor wafer in the presence of nitrogen gas and at a pressure of from about 20 to 760 Torr to improve the reflectivity of the surface of the resulting tungsten layer, as well as to improve the tungsten deposition rate.

These and other objects of the invention will be apparent from the following description and accompanying flowsheet illustrating the process of the invention.

BRIEF DESCRIPTION OF THE DRAWING

The sole figure is a flow sheet illustrating the process of the invention.

DETAILED DESCRIPTION OF THE INVENTION

The invention provides improvements in the process for forming a layer of tungsten over a semiconductor wafer whereby the reflectivity of the surface of the tungsten layer may be improved, and the rate of deposition of the tungsten layer may be increased as well.

In one embodiment, the reflectivity of the surface of the tungsten layer may be improved by the presence of nitrogen gas during the deposition. The deposition rate may also be improved by increasing the pressure during the deposition, which will also have a beneficial effect on the reflectivity of the surface of the resulting tungsten layer.

Furthermore, in another embodiment, the process also includes improving the uniformity of the coating layer by forming a nucleation layer on the wafer prior to forming the tungsten layer.

In the practice of the process: of the invention, a semiconductor wafer is utilized such as a silicon substrate which may have portions of an integrated circuit structure already formed therein, such as, for example, one or more transistors. An insulating layer, such as a silicon oxide layer, which has been previously patterned to provide openings or vias to underlying portions of the integrated circuit structure formed in the silicon substrate will usually have been formed over the underlying silicon substrate and the integrated circuit structures formed therein.

An intermediate layer is formed over the insulating layer to facilitate adherence of the tungsten layer to the underlying structure, since a layer of tungsten cannot be applied by chemical vapor deposition (CVD) directly to a silicon oxide layer. The intermediate layer may comprise any material which is chemically compatible with both the underlying insulating layer and the tungsten layer which will be applied thereon, including good adhesion to both the tungsten and insulating layers.

Examples of materials which may comprise the intermediate layer include sputtered tungsten, sputtered titanium tungsten (TiW), or titanium nitride (TiN), which may be applied by sputtering of TiN, reactive sputtering of a titanium target in the presence of nitrogen, sputtering of titanium followed by thermal reaction with nitrogen, or by CVD deposition of TiN.

In accordance with one embodiment of the invention, a tungsten layer is deposited directly over the intermediate layer by CVD deposition using a combination of $WF_6$, Ar, $N_2$, and $H_2$ gases in a vacuum chamber. The gaseous mixture is flowed into the vacuum deposition chamber at a rate of from about 20 to about 200 standard cubic centimeters per minute (sccm) of $WF_6$, preferably from about 20 to about 100 sccm; from about 100 to about 5000 sccm of an inert carrier gas such as argon, preferably about 1000 to about 3000 sccm; from about 10 to about 300 sccm of nitrogen; and from about 300 to about 3000 sccm of hydrogen, preferably about 500 to about 2000 sccm.

The presence of nitrogen in the mixture of gases used in the tungsten deposition, in accordance with the invention, has been found to increase the reflectivity of the deposited tungsten layer which facilitates the use of photolithography in a subsequent patterning step. The reflectivity of the tungsten layer is measured as a comparison to the reflectivity of a silicon layer, with 100% indicating a reflectivity equal to that of a silicon surface.

During the tungsten CVD deposition, the pressure in the vacuum chamber is maintained at from about 20 to about 760 Torr, preferably from about 60 to about 100 Torr, and most preferably from about 75 to about 85 Torr, typically about 80 Torr. It should be noted that this pressure is considerably higher than prior art CVD tungsten deposition processes where the pressure rarely exceeded 1 Torr. This higher pressure results in markedly faster deposition rates which, as will be discussed below, may be as much as an order of magnitude greater than prior art tungsten deposition rates. The higher pressure of the process of the invention also is beneficial in the increase of reflectivity of the surface of the deposited tungsten layer.

The use of such high pressures, in accordance with the invention, may be of further interest with respect to adjustment of the stress formed in the CVD deposited tungsten layer by permitting more adjustment of the $WF_6$ and $H_2$ flow rates as well as the flow rate of the diluent gas due to the higher overall flow rates of the gases in the mixture. While we do not wish to be bound by any theories of operation of the process, it may also be that the higher flow rates are changing the growth mechanism of the layer which may change the mechanical stress on the tungsten layer.

The temperature of the susceptor, i.e., the wafer support plate, in the chamber is maintained in a range of from about 350° C. to about 525° C., preferably in a range of from about 450° C. to about 475 C. during the deposition.

The deposition time will vary with the desired thickness of tungsten layer 40. The tungsten deposition rate of the process of the invention, which is faster than the prior art deposition rates by as much as a order of magnitude, may vary from about 2000 to about 7000 Angstroms per minute. For example, to deposit a tungsten layer of from about 0.8 microns to about 1.5 microns, typical about 1 micron, utilizing the process of the invention, the deposition time may vary from about 2 to about 7 minutes.

The deposition may be carried out in any commercially available CVD deposition equipment capable of being operated within the temperature and pressure ranges discussed above. An example of such commercially available equipment is the Precision 5000 multichamber deposition and etching system available from Applied Materials, Inc. in Santa Clara, Calif. A multichambered apparatus of this type which may be used in the practice of this invention is described and claimed in Toshima U.S. Pat. No. 4,785,962, assigned to the assignee of this application and cross-reference to which is hereby made.

In such an apparatus, wherein the gas distribution inlet or "showerhead⇌ distance from the wafer may be adjusted, the wafer may be spaced from the gas inlet a distance of from about 200 to 600 mils, preferably about 300 to 500 mils, typically about 400 mils. However, the spacing, at least within the 300 to 500 mils range, has not been found to be critical to the operation of the process of the invention.

In yet another embodiment of the process of the invention, a nucleation layer is formed over the intermediate layer prior to deposition of the tungsten layer. The purpose of this nucleation layer is to provide a layer of growth sites to promote uniform deposition of a tungsten layer thereon. The need for such a nucleation layer will vary, depending upon the materials used in forming the intermediate layer. When sputtered tungsten or sputtered titanium tungsten comprises the intermediate layer, the need for formation of a nucleation layer is diminished and may be dispensed with entirely, if desired. However, when the intermediate layer comprises a titanium nitride layer, it is important to form the nucleation layer prior to deposition of the tungsten layer, in accordance with the practice of this embodiment of the invention, since a layer of CVD tungsten deposited directly over a titanium nitride layer (without the nucleation layer of the invention) has been found to have as much as a 10-15% difference in thickness and resistivity over the entire layer.

To form the nucleation layer in accordance with the practice of the process of the invention, a semiconductor wafer, which may have insulating and intermediate layers formed thereon, as described above, is placed in a CVD apparatus such as previously described and a mixture of gases which includes silane ($SiH_4$) is flowed into the chamber.

The flowing mixture of gases will include from about 5 to about 50 sccm of $WF_6$, from about 5 to about 50 sccm of $SiH_4$, from about 500 to about 3000 sccm of Ar, and from about 20 to about 300 sccm of $N_2$.

As in the tungsten deposition process already described, the pressure in the vacuum chamber is maintained at from about 20 to about 760 Torr, preferably from about 60 to about 80 torr, and most preferably from about 75 to about 85 Torr, typically about 80 Torr, while the susceptor temperature is maintained in a range of from about 350° C. to about 525° C., preferably in a range of from about 450° C. to about 475° C.

Growth of a sufficient thickness of the nucleation layer, i.e., from about 200 to about 1000 Angstroms, will occur in about 5 to about 20 seconds under the above conditions. While a thicker layer may be deposited by extending the process time, such is unnecessary for the purposes intended, i.e., to promote a more uniform deposition of the tungsten layer.

The following examples will serve to further illustrate the process of the invention.

EXAMPLE I

A 150 mm (6") diameter silicon wafer, having a layer of titanium nitride previously formed thereon over a silicon oxide layer, was placed in a CVD vacuum chamber maintained at a pressure of 80 Torr and a susceptor temperature of 450° C. A mixture of gases comprising 1000 sccm of Ar, 20 sccm of $SiH_4$, 20 sccm of $WF_6$, and 50 sccm of $N_2$ were flowed into the chamber for a period of about 10 seconds from an outlet spaced 400 mils from the wafer to deposit about 500 Angstroms of a nucleation layer on the wafer.

EXAMPLE II

The wafer coated with the nucleation layer in Example I, together with similar sized silicon wafers, respectively coated with sputtered tungsten and sputtered titanium tungsten over silicon oxide, but without a nucleation layer, were individually placed in a CVD vacuum chamber under the same pressure, temperature, and gas outlet spacing conditions as described in Example I and a gaseous mixture of 1500 sccm of Ar, 1000 sccm of $H_2$, 30 sccm of $WF_6$, and 50 sccm of $N_2$ were flowed into the chamber for a time period of about 3 minutes.

When each of the wafers was removed, it was examined to determine the properties of the resulting tungsten layer. Each wafer was found to have a uniform layer of tungsten deposited thereon of about 9000 Angstrom thickness (indicating a deposition rate of about 3000 Angstroms/minute) with less than 2% variation in coating thickness, as measured by the resistivity of the layer.

The respective reflectivity of the surface of the tungsten layers was found to be 100% for each tungsten layer, compared to the reflectivity of a silicon surface. The resistivity of each of the tungsten layers was measured at about 8.5 micro ohm centimeters, and the stress was measured at about $6 \times 10^9$ dynes/$cm^2$.

EXAMPLE III

To further illustrate the process of the invention, a 6" wafer having a sputtered titanium tungsten layer thereon, similar to one of the wafers used in Example II, was placed in the same CVD vacuum chamber under the same conditions except that nitrogen was not included in the gas mixture flowing into the CVD chamber.

The wafer was then removed and examined. The reflectivity of the tungsten surface was measured and found to be 60% of the reflectivity of silicon. The resistivity was measured at 9 micro ohm centimeters and the stress was measured at $9 \times 10^9$ dynes/$cm^2$.

EXAMPLE IV

Another wafer, identical to one of the wafers used in Example II, was placed in the CVD vacuum chamber and processed under identical conditions to those of Examples II and III except that the temperature was raised to 475° C., and the Ar and $H_2$ gas flow rates were respectively raised to 2500 sccm and 1500 sccm. The process was carried out for about 3 minutes and about 9000 Angstroms of tungsten was deposited. The reflectivity of the tungsten surface was measured and found to be at least 100% The deposition rate, therefore, was the same as in Example II, i.e., about 3000 Angstroms/minute. The stress of the resulting tungsten layer was measured at about $1-2 \times 10^9$ dynes/$cm^2$.

EXAMPLE V

To illustrate the effect of the high pressure used in the process as opposed to a lower process, a 6" diameter wafer was identically processed as in Example II except that the pressure was lowered from 80 Torr down to only 10 Torr. The resultant tungsten layer had a reflectivity which was only 20% that of silicon. Thus, the invention provides an improved process for the formation of a tungsten layer on a semiconductor wafer wherein the deposition rate and the reflectivity are improved by carrying out the deposition process at a markedly higher pressure than the prior art, the reflectivity is also improved by the presence of nitrogen in the gases used in the deposition, and the formation of a nucleation layer enhances the uniformity of the tungsten layer, particularly when used over a titanium nitride layer.

Having thus described the invention, what is claimed is:

1. An improved process for the deposition of a layer of tungsten on a semiconductor wafer in a vacuum chamber wherein the improvement comprises depositing tungsten on a intermediate layer formed over a silicon dioxide layer on said semiconductor wafer by contacting said wafer with a mixture of gases flowing through said vacuum chamber comprising:
    (a) from about 20 to about 200 sccm $WF_6$;
    (b) from about 100 to about 5000 sccm Ar;
    (c) from about 10 to about 300 sccm $N_2$, and
    (d) from about 50 to about 2000 sccm $H_2$;
while maintaining the pressure in said vacuum chamber at from about 20 to about 760 Torr and the susceptor temperature at from about 450° C. to about 475° C. during said tungsten deposition step wherein the presence of nitrogen gas improves the reflectivity of the resulting layer of tungsten.

2. The improved process of claim 1 wherein the improvement further comprises the additional step of forming a nucleation layer on the semiconductor wafer over a previously formed titanium nitride intermediate layer and prior to said tungsten deposition step to improve the uniformity of the deposited tungsten layer.

3. The improved process of claim 1 wherein the improvement further comprises depositing said tungsten at a pressure of from about 60 to 100 Torr to improve the tungsten deposition rate, as well as the reflectivity of the surface of the tungsten layer.

4. An improved process for the deposition of a layer of tungsten over a layer of silicon dioxide previously formed on a semiconductor wafer in a vacuum chamber wherein the improvement comprises:
 (a) forming an intermediate layer selected from the group consisting of a tungsten, a titanium tungsten, and a titanium nitride layer over said silicon dioxide layer; and
 (b) depositing tungsten over said intermediate layer on said semiconductor wafer in the presence of a mixture of gases comprising:
  (i) from about 20 to about 200 sccm $WF_6$;
  (ii) from about 100 to about 5000 sccm Ar;
  (iii) from about 10 to about 300 sccm $N_2$, and
  (iv) from about 300 to about 3000 sccm $H_2$; while maintaining the pressure in said vacuum chamber at from about 20 to about 760 Torr and the susceptor temperature at from about 350° C. to about 525° C. during said tungsten deposition step.

5. The improved process of claim 4 wherein the pressure in said vacuum chamber during said deposition is maintained at from about 60 Torr to about 100 Torr.

6. The improved process of claim 4 wherein the pressure in said vacuum chamber during said deposition is maintained at from about 75 Torr to about 85 Torr.

7. An improved process for the deposition of a layer of tungsten on an intermediate layer formed over a silicon dioxide layer on a semiconductor wafer in a vacuum chamber wherein the improvement comprises depositing tungsten on said intermediate layer on said semiconductor wafer by contacting said wafer with a mixture of gases flowing through said vacuum chamber comprising:
 (a) from about 20 to about 200 sccm $WF_6$;
 (b) from about 100 to about 5000 sccm Ar;
 (c) from about 10 to about 300 sccm $N_2$, and
 (d) from about 300 to about 3000 sccm $H_2$; while maintaining the pressure in said vacuum chamber at from about 20 Torr to about 760 Torr and the susceptor temperature at from about 350° C. to about 525° during said tungsten deposition step.

8. The process of claim 1 which further comprises the additional step of forming a nucleation layer over said intermediate layer prior to said tungsten deposition step to improve the uniformity of the deposited tungsten layer.

9. The process of claim 8 wherein said step of forming said nucleation layer further comprises contacting said wafer with a mixture of $WF_6$, $N_2$, Ar, and $SiH_4$ gases in a vacuum chamber to improve the uniformity of the deposited layer of tungsten.

10. The improved process of claim 9 wherein the flow rates of said gases flowing through said vacuum chamber to form said nucleation layer comprise:
 (a) from about 5 to about 50 sccm $WF_6$;
 (b) from about 500 to about 3000 sccm Ar;
 (c) from about 20 to about 300 sccm $N_2$, and
 (d) from about 5 to about 50 sccm $SiH_4$.

11. The improved process of claim 7 wherein the improvement further comprises depositing tungsten on a semiconductor wafer at a pressure of from about 60 to about 100 Torr to improve the tungsten deposition rate, as well as the reflectivity of the surface of the tungsten layer.

12. The improved process of claim 1 wherein the improvement further comprises depositing said tungsten at a pressure of from about 75 to 85 Torr.

13. The improved process of claim 7 wherein the susceptor temperature is maintained at from about 450° C. to about 475° C. during said tungsten deposition step.

14. An improved process for the deposition of a layer of tungsten on an intermediate layer formed over a silicon dioxide layer on a semiconductor wafer in a vacuum chamber wherein the improvement comprises depositing tungsten on said intermediate layer on said semiconductor wafer by contacting said wafer with a mixture of gases flowing through said vacuum chamber comprising:
 (a) from about 20 to about 200 sccm $WF_6$;
 (b) from about 100 to about 5000 sccm Ar;
 (c) from about 10 to about 300 sccm $N_2$, and (d) from about 300 to about 3000 sccm $H_2$;
while maintaining the pressure in said vacuum chamber at from about 75 Torr to about 85 Torr and the susceptor temperature at from about 450° C. to about 475° C. during said tungsten deposition step.

15. The improved process of claim 14 wherein said intermediate layer comprises titanium nitride and the improvement further comprises the additional step of forming a nucleation layer over said titanium nitride intermediate layer on said semiconductor wafer prior to said tungsten deposition step.

16. The process of claim 15 wherein said step of forming said nucleation layer further comprises contacting said wafer with a mixture of $WF_6$, $N_2$, Ar, and $SiH_4$ gases in a vacuum chamber to improve the uniformity of the deposited layer of tungsten.

17. The improved process of claim 14 wherein said previously formed intermediate layer over said silicon dioxide layer on said semiconductor wafer is selected from the group consisting of a tungsten, a titanium tungsten, and a titanium nitride layer.

18. An improved process for the deposition of a layer of tungsten on a semiconductor wafer in a vacuum chamber wherein the improvement comprises:
 (a) forming a nucleation layer on a semiconductor wafer prior to the step of depositing tungsten on the semiconductor wafer by contacting said wafer with a mixture of gases flowing through said vacuum chamber to form said nucleation layer comprising:
  (i) from about 5 to about 50 sccm $WF_6$;
  (ii) from about 500 to about 3000 sccm Ar;
  (iii) from about 20 to about 300 sccm $N_2$, and
  (iv) from about 5 to about 50 sccm $SiH_4$; and
 (b) then depositing tungsten on said semiconductor wafer over said nucleation layer by contacting said wafer with a mixture of gases flowing through said vacuum chamber comprising:
  (i) from about 20 to about 200 sccm $WF_6$;
  (ii) from about 100 to about 5000 sccm Ar;
  (iii) from about 10 to about 300 sccm $N_2$, and
  (iv) from bout 300 to about 3000 sccm $H_2$; while maintaining the pressure in said vacuum chamber at from about 75 Torr to about 85 Torr and the susceptor temperature at from about 450° C. to about 475° C. during said tungsten deposition step.

* * * * *